United States Patent
Vatinel (12)

(10) Patent No.: US 6,323,715 B1
(45) Date of Patent: Nov. 27, 2001

(54) METHOD AND APPARATUS FOR SELECTING A CLOCK SIGNAL WITHOUT PRODUCING A GLITCH

(75) Inventor: Christophe Vatinel, Le Rouret (FR)

(73) Assignee: Koninklijke Philips Electronics N.V. (KPEUV), Eindhoven (NL)

( * ) Notice: Subject to any disclaimer, the term of this patent is extended or adjusted under 35 U.S.C. 154(b) by 0 days.

(21) Appl. No.: 09/475,697

(22) Filed: Dec. 30, 1999

(51) Int. Cl.[7] .................................................. H03K 17/62
(52) U.S. Cl. ............................................ 327/407; 327/298
(58) Field of Search .................................... 327/407, 298, 327/408, 411, 144, 145, 154, 294, 99, 152, 276

(56) References Cited

U.S. PATENT DOCUMENTS

| | | |
|---|---|---|
| 4,855,615 | 8/1989 | Humpleman ........................ 327/144 |
| 5,231,636 | 7/1993 | Rasmussen . | |
| 5,357,146 | 10/1994 | Heimann ............................ 327/292 |
| 5,564,042 | 10/1996 | Ventrone . | |
| 5,604,452 | * 2/1997 | Huang ................................ 327/99 |
| 5,726,593 | 3/1998 | Ruuskanen . | |
| 5,790,609 | 8/1998 | Swoboda . | |
| 5,811,995 | 9/1998 | Roy et al. ........................... 327/99 |
| 5,903,746 | 5/1999 | Swoboda et al. . | |
| 6,107,841 | * 8/2000 | Goodnow ............................ 327/99 |

FOREIGN PATENT DOCUMENTS

| | | |
|---|---|---|
| 0 969 350 A2 | 1/2000 | (EP) . |
| 0 969 350 A3 | 1/2001 | (EP) . |

* cited by examiner

Primary Examiner—Timothy P. Callahan
Assistant Examiner—Linh Nguyen

(57) ABSTRACT

A method and apparatus adapted for glitchless switching between unrelated clock signals is achieved using simple AND/OR logic gates to form the circuit that synchronizes the clock inputs. In an example embodiment of the present invention, two clock signals are generated along with a select input signal capable of deselecting one of the clock signals and delaying selection of the second clock input signal. The first and second clock signals and the select input signal are multiplexed to generate a multiplexed output clock signal corresponding to one of the input clock signals. A selection delay is generated between the deselection of the first clock signal and the selection the second clock signal that is longer than the low pulse width of the minimum low pulse width of the first clock signal and the low pulse width of the second clock signal, such that switching between clock signals will not create a glitch at the multiplexed output.

29 Claims, 7 Drawing Sheets

METHOD AND APPARATUS FOR SELECTING A CLOCK SIGNAL WITHOUT PRODUCING A GLITCH

FIELD OF THE INVENTION

The present invention relates generally to a method and apparatus for switching between clock inputs in a multiplexer without causing a glitch in the output signal.

BACKGROUND OF THE INVENTION

In digital systems that include multiplexers, an output signal is generated from two or more data inputs and one or more select signals. The number of data or clock inputs "n" is less than or equal to $2^k$, where k=the number of select inputs. In a standard multiplexer, once the select input(s) change, the output will begin to reflect the newly selected data input as soon as the select input propagates through the internal logic. If the data input signals being selected are asynchronous to each other, the output pulse width or duration may be narrower than the narrowest data input pulse width. This is called a "glitch", which can cause substantial problems in digital systems. Any sub-minimum pulse width can violate the timing specification and requirements for other elements in the system causing a variety of operational malfunctions which may range from transitory to more permanent crashes.

In particular, a glitch can be any clock pulse or duration, either high or low, that is shorter in duration than the corresponding pulse of the input clock before or after the clock selection switching. For example, if the system is currently synchronized on a clock of 100 MHz and a switch is made to a clock system of 125 MHz, both clocks having a 50% duty cycle, no clock pulse of duration shorter than four nanoseconds can be generated during selection switching without otherwise resulting in a glitch. Thus a need exists for a method of switching from one clock signal to another clock signal without generating a glitch in the output signal.

SUMMARY OF THE INVENTION

Generally, the present invention relates to digital clocks and to switching between clock signals without generating a glitch at the output. One important advantage of the present invention is the glitchless switching using simple AND/OR gates and logic to form the circuit and to synchronize the clock inputs. Accordingly, a method is described herein that addresses this need of glitchless switching without using a complex synchronizing approach. In one example embodiment, a method includes generating a first and a second clock input signal. A select input signal is then synchronized with the first clock input signal and is capable of deselecting the first clock signal and delaying selection of the second clock signal. The first and second clock signals are then multiplexed with the select input signal to generate a multiplexed clock output signal corresponding to one of the clock input signals. A switch is then made from the first clock signal to the second clock signal without producing a glitch at the multiplexed output, the multiplexed output producing a momentary low pulse of width that is longer than the minimum of the low pulse of the first clock and low pulse of the second clock. The momentary low pulse is produced before an output signal corresponding to the second clock input clock signal is produced, the momentary pulse width being a function of the selection delay of the select input signal.

In another example embodiment, a method of switching between asynchronous data inputs in a digital system is achieved without causing a glitch in the output. A first gated clock signal is generated by synchronizing a first gating select input signal to a first clock input signal. A second gated clock signal is generated by synchronizing a second gating select input signal to a second clock input signal. The first and second gated clock output signals are then multiplexed with a select input signal selection delay to generate a multiplexed clock output signal corresponding to one of the clock input signals. A switch is then made from the first gated clock input signal to the second gated clock input signal without producing a glitch at the multiplexed output, the multiplexed output producing a momentary low pulse of width that is longer than the minimum of the low pulse of the first clock and the low pulse of the second clock. The momentary low pulse is produced before an output signal corresponding to the second clock input clock signal is produced, the momentary pulse width being a function of the selection delay of the select input signal.

According to another aspect of the invention, a method of switching between asynchronous data inputs in a digital system is achieved without causing a glitch in the output. A first gated clock signal output is generated by synchronizing a first gating select input signal to the falling edge of a first clock input signal. A second gated clock signal output is generated by synchronizing a second gating select input signal to the falling edge of a second clock input signal. The first and second gated clock signals are then multiplexed with a selection input signal delay to generate a multiplexed output clock signal corresponding to one of the gated clock signals. A no-select guardband is generated between the first and second select input signals to synchronize switching from the first gated clock signal to the second gated clock signal such that momentarily the multiplexed clock output produces a pulse of duration longer than the minimum of the low pulse of the first and the low pulse of the second clock input signals. The momentary pulse is produced before an output signal corresponding to the second clock input clock signal is produced, the momentary low pulse width being a function of the selection delay of the select input signal.

In another aspect of the invention, a digital circuit is adapted for switching between two or more asynchronous data inputs without causing a glitch in the output. The circuit includes a first clock signal generator and a second clock signal generator adapted to generate a first and a second clock input signal, respectively. The circuit also includes a select input signal generator that generates a select signal that is synchronized with the first clock input signal, the select input signal generator capable of deselecting the first clock signal and delaying selection of the second clock signal. A digital multiplexer coupled to the clock signals and the select input signal multiplexes the first and second clock input signals with the select input signal selection delay to generate a clock output signal corresponding to one of the clock input signals. The circuit switches from the first clock input signal to the second clock input signal without producing a glitch at the multiplexed output, the multiplexed output producing a momentary low pulse of width that is longer than the minimum of the low pulse of the first clock signal and the low pulse of the second clock signal. The momentary low pulse is produced before an output signal is produced corresponding to the second clock input clock signal, the momentary low pulse width being a function of the selection delay of the select input signal.

In yet another aspect of the invention, a digital circuit is adapted for switching between two or more asynchronous data inputs without causing a glitch in the output. The circuit includes a first subcircuit for generating a first gated clock signal output signal synchronized by a first gating select input signal to a first clock input signal. A second subcircuit is included for generating a second gated clock signal by synchronizing a second gating select input signal to a second clock input signal. A digital multiplexer coupled to the first and second subcircuits is included for multiplexing the first and second gated clock output signals with a select input signal selection delay to generate a clock output signal corresponding to one of the clock input signals. A switching circuit coupled to the subcircuits is included for switching from the first gated clock input signal to the second gated clock input signal without producing a glitch at the multiplexed output, the multiplexed output producing a momentary low pulse of width that is longer than the minimum of the low pulse of the first clock and the low pulse of the second clock, before producing an output signal corresponding to the second clock input clock signal.

The above summary of the present invention is not intended to describe each illustrated embodiment or every implementation of the present invention. The figures and the detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
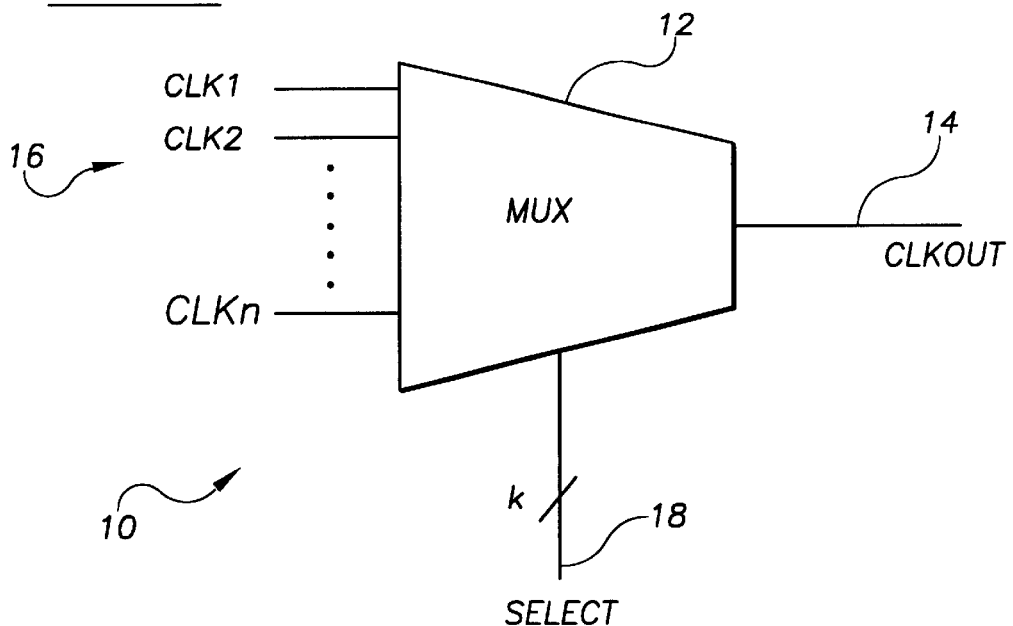
FIG. 1 is a prior art example of clock selector using a multiplexer to generate a single output signal from several clock inputs and a select signal.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to digital systems and digital clocks. The invention is particularly suited for systems utilizing multiplexers that require the selection between one or more input clock signals without generating a glitch in the output signal. One of the important advantages to the present invention is the simplicity of design for hardware implementation purposes. Further, the present invention permits the selection among several unrelated and asynchronous clocks; with one of them being an output, without producing glitches during the change to the selected clock. While the present invention is not necessarily so limited, an appreciation of various aspects of the invention may be obtained through a discussion of various application examples in such an environment.

In one example application of the present invention, a method of switching between asynchronous data inputs in a digital system is achieved without causing a glitch in the output. A first and a second clock input signals are first generated. A select input signal is then synchronized with the first clock input signal and is capable of deselecting the first clock signal and delaying selection of the second clock signal. The first and second clock signals are then multiplexed with the select input signal to generate a multiplexed clock output signal corresponding to one of the clock input signals. A switch is then made from the first clock signal to the second clock signal without producing a glitch at the multiplexed output, the multiplexed output producing a momentary low pulse of width that is longer than the minimum of the low pulse of the first clock and low pulse of the second clock. The momentary low pulse is produced before an output signal corresponding to the second clock input clock signal is produced, the momentary low pulse width being a function of the selection delay of the select input signal.

In another example application, a digital circuit is adapted for switching between two or more asynchronous data inputs without causing a glitch in the output. The circuit is capable of multiplexing two clock signal inputs with two select input signals such that there is a selection delay created between the two select signals. The select signals are synchronized with the help of a counter and select guardband signal that helps create the delay between the two select signals. During the selection delay, the first clock signal is deselected for a time period before the second clock signal is selected. The multiplexed output indicates a momentary low pulse between the time that the clock signals are switched but no glitch is generated.

Referring now to FIG. 1, a prior art example of clock selector circuit 10 using a multiplexer 12 to generate a single output signal 14 from several clock inputs 16 and a select signal 18. Clock input signals CLK1, CLK2 . . . CLKn are unrelated and unsynchronized signals that are each one bit wide. SELECT signal 18 is the selection input signal that codes a value from 1 to n and the signal is k bits wide (where k is the next greater or equal integer of $\log_2 (n)$). Output signal 14 is the clock output signal that results from the selection of one of the clock inputs that is selected by SELECT signal 18. With this current approach, glitches are formed at output 14 due to lack of synchronization when switching from one clock signal to another.

Figure 2:
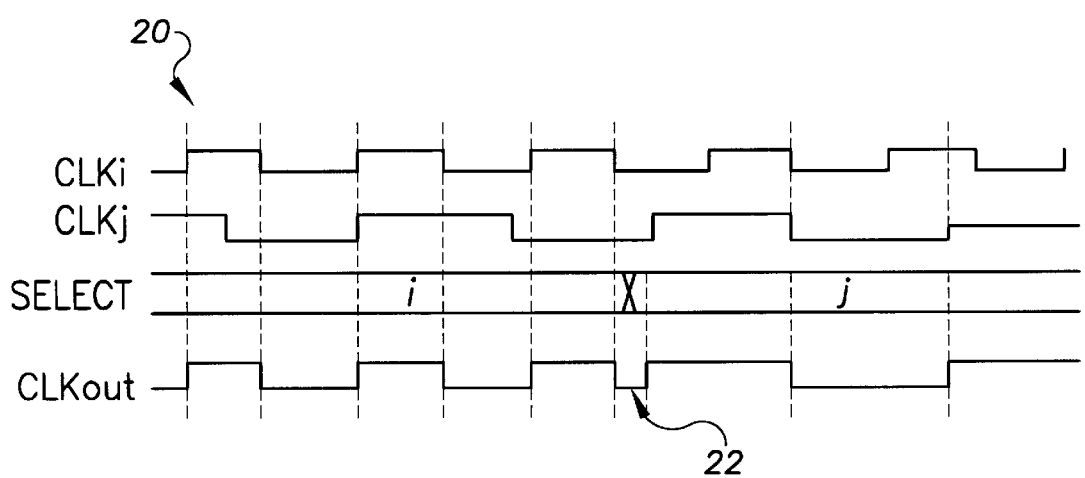
FIG. 2 is a prior art example of a timing diagram illustrating a glitch formation when switching between two clock input signals.

Referring now to FIG. 2, a timing diagram 20 of a multiplexed system of clock signals illustrates a glitch at the output when switching occurs between one clock input and another clock input. In this example, the SELECT signal during period i is synchronized with the corresponding clock input CLKi. When the SELECT signal is high the output at CLKOUT is also high and corresponds to signal CLKi. When the SELECT signal moves into the j period, CLKi signal is deselected. During period j, the SELECT signal is synchronized to the leading edge of the corresponding clock input CLKj, eventually resulting in a signal generated at the output of CLKOUT when the SELECT signal goes high during period j. When the switch is made from one input signal to another, the change will be reflected in the output CLKOUT. However, due to the lack of synchronization when moving from period i to period j in the SECLECT signal, where the SELECT signal goes high in period j before deselecting CLKi during period i, a low pulse glitch 22 occurs at the CLKOUT. Note that the pulse is shorter in duration than the original input signal CLKi. Where the switching between clock signals occurs too quickly, a high and a low glitch can occur at CLKOUT.

Figure 3:
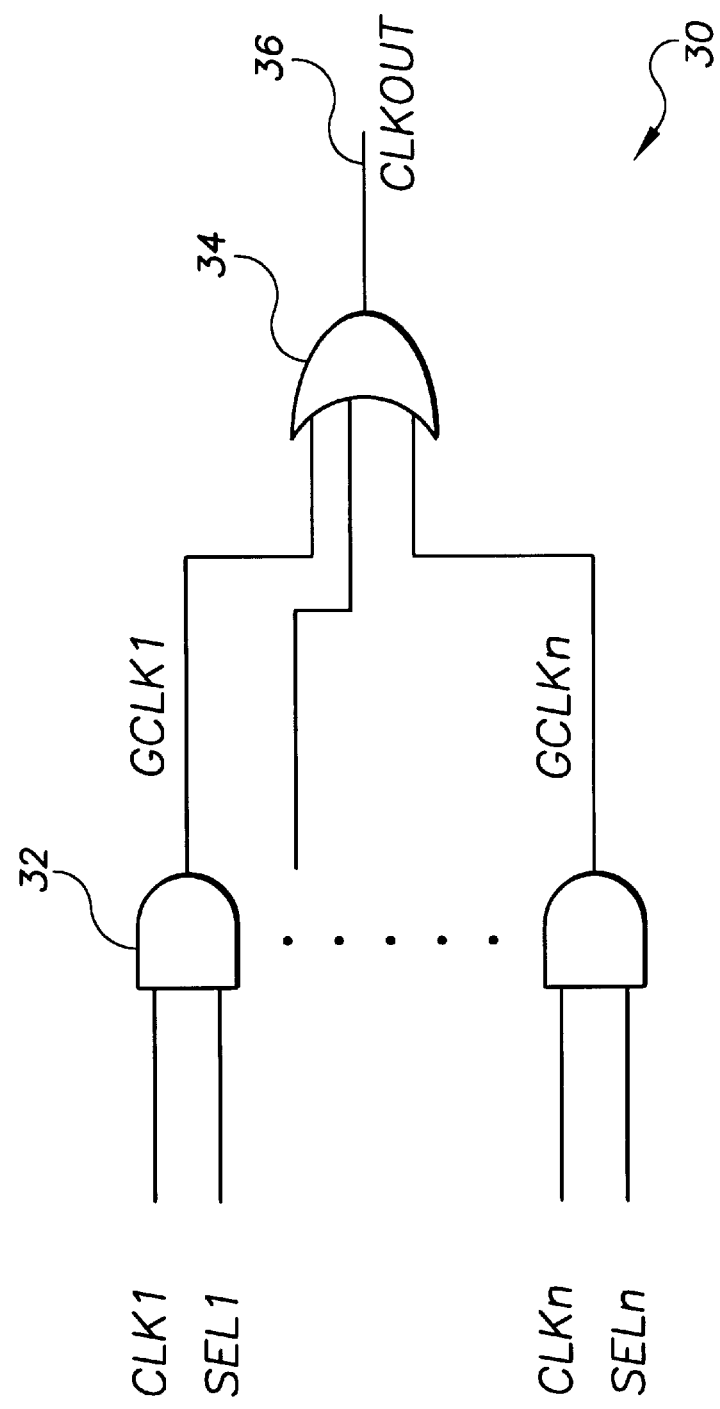
FIG. 3 is an example embodiment of a logic diagram using AND/OR logic to perform the multiplex function of clock inputs and select inputs, made in accordance with the present invention.

Referring now to FIG. 3, a logic diagram 30 illustrates an example embodiment of AND 32 and OR 34 gates performing the multiplex function of gated clock signals GCLK1 through GCLKn that results in an output signal CLKOUT 36. Each input clock signal CLKi will be gated by an individual select signal SELi, to generate a gated clock signal GCLKi. This is true for all inputs up to CLKn, as see in diagram 30. This will be expanded further in the discussion of FIG. 5.

Figure 4:
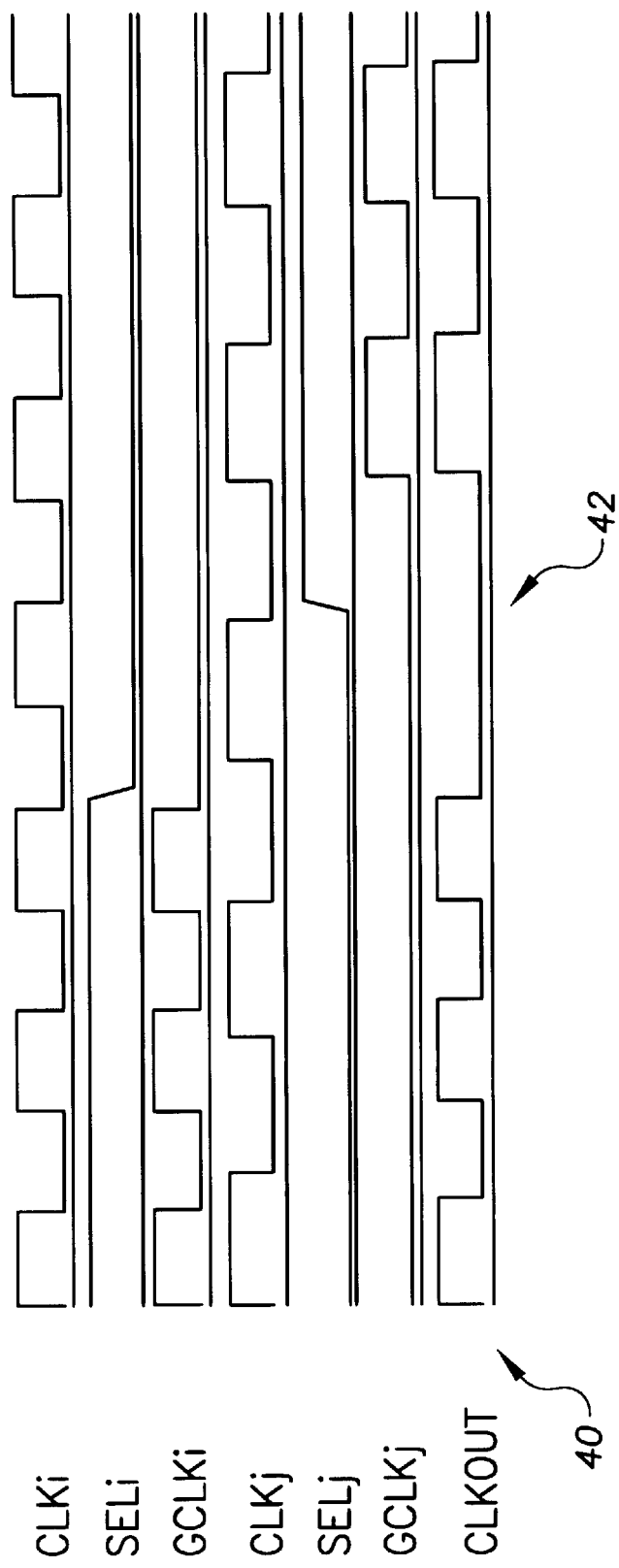
FIG. 4 is a timing diagram illustrating the multiplexer output of an example embodiment of the present invention.

Referring now to FIG. 4, a timing diagram 40 exhibits the multiplexed output without a glitch when using an example embodiment of the present invention. Gating signal SELECT i (SELi) is synchronized to the falling edge of CLKi such that no signal is generated at the output of GCLKi (low) when SELi goes low. Gating signal SELECT j (SELJ) is synchronized to the falling edge of the corresponding clock input CLKj, resulting in a signal generated at the output of GCLKj (high) when SELi goes high. Initially, the output of CLKOUT corresponds to signal GCLKi, which corresponds to input signal CLKi since SELi is the only selection input that is high. The switch is then made from one input signal to another as SELi goes low and SELj goes high, a no-select guardband 42 is formed and used. The switch is reflected in the change in output at CLKOUT without a glitch occurring. The no-select guardband controls synchronization between selection input signals SELi and SELj, such that SELj goes high after SELi goes low, creating a period of duration where no signal is selected. Momentarily, no output signal is generated in CLKOUT corresponding to the no signal selection period driven by the no select guardband. The duration period of the no-select guardband in this example is about one clock pulse of the first clock input. Note that at CLKOUT the no signal pulse is longer in duration than the original input signal CLKi low pulse and longer in duration than the new selected input signal CLKj low pulse.

Figure 5:
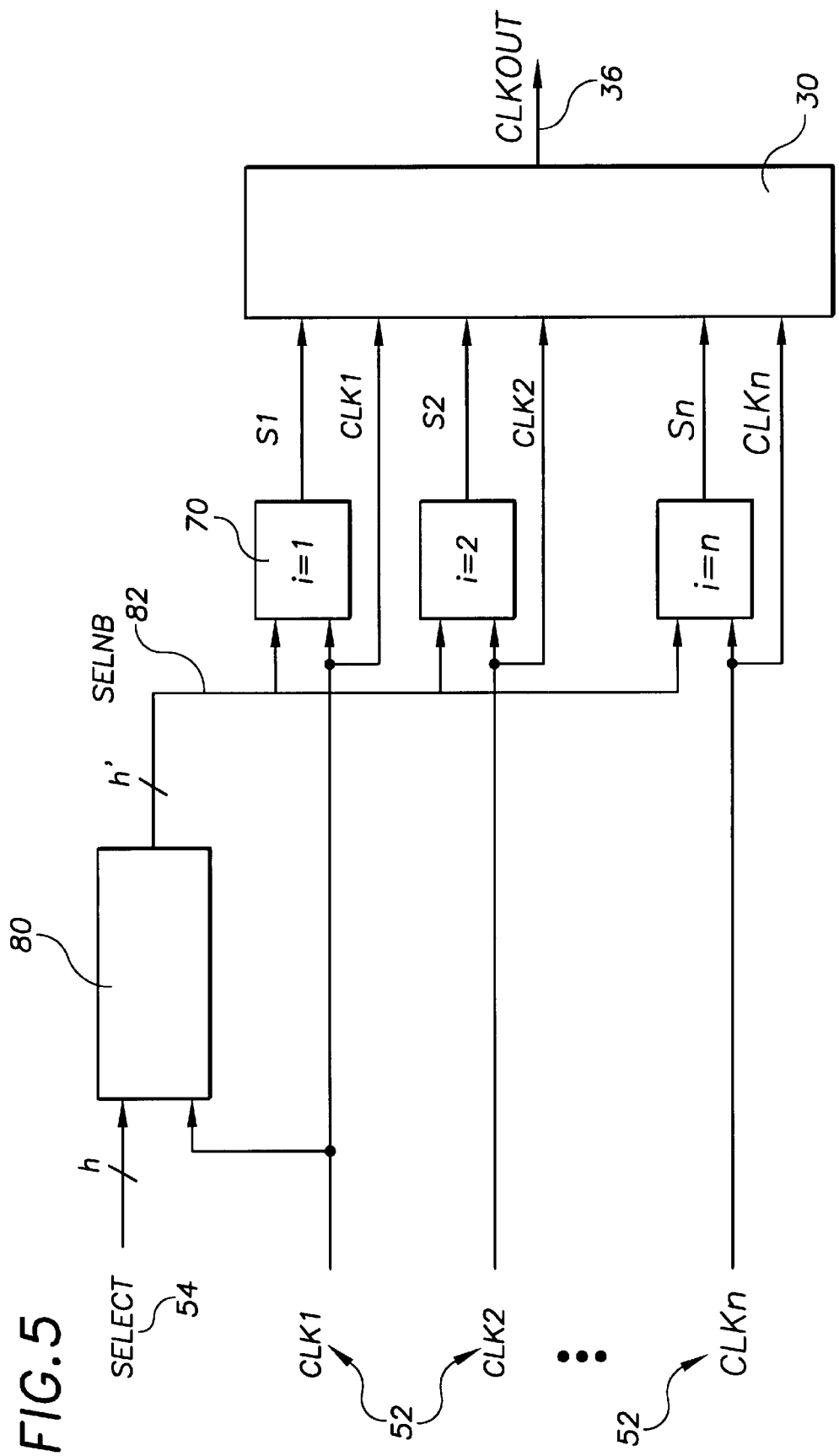
FIG. 5 is an expanded logic diagram of an example embodiment of switching clock signals using a no-select guardband to avoid glitches, made in accordance with the present invention.

Referring now to FIG. 5, an expanded logic diagram 50 of an example embodiment of switching clock signals is illustrated using a no-select guardband to avoid glitches, made in accordance with the present invention. Clock input signals 52 are fed into a no-select guardband circuit 80, an individual select signal circuit 70 and multiplexer circuit 30. Clock signal CLK1 is fed along with signal SELECT 54 into no-select guardband circuit 80 to generate a no-select guardband signal SELNB 82 that is then fed into one of each individual select signal circuits 70 corresponding to each of the clock input signals. At circuits 80, individual selection signals are created for each of the clock inputs 52 by decoding the value of SELNB 82 and resynchronizing the output on the falling edge of the corresponding clock signal. This is elaborated on in the discussion of FIG. 8. Clock output CLKOUT 36 is generated by multiplexing these inputs through circuit 30 with the SELNB 82 signal to generate a clock signal output corresponding to one of the selected clock input signals. The actual synchronization between the selection input signals is addressed in the following example embodiments.

Figure 6:
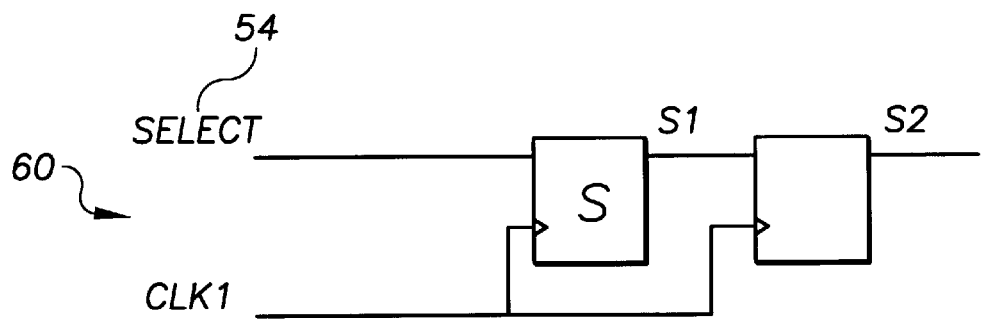
FIG. 6 is a logic diagram of an example embodiment of synchronization of the selection input signal.

FIG. 6 is a logic diagram of an example embodiment of subcircuit 60 for synchronizing 25 selection input SELECT with input clock signal CLK1, that has a period of P1. SELECT input 54, that may be asynchronous with CLK1, is synchronized with a synchronizer flip-flop to generate a synchronized select signal S1. S1 is then synchronized to clock CLK1 by a normal flip-flop to generate a synchronized S2 signal. If the mean time between failure (MTBF) is not big enough, another synchronizer stage may be added. Circuit 60 then serves as the input to no-select guardband circuit 81 shown in FIG. 8.

Figure 7:
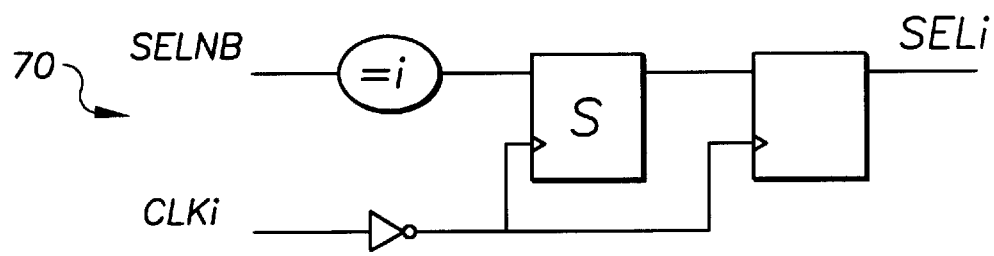
FIG. 7 is a logic diagram of an example embodiment of synchronization of the selection input signal in connection with the no-select guardband.

FIG. 7 is a logic diagram 70 of an example embodiment of synchronization of the selection-input signal in connection with the no-select guardband. Individual select signal circuit 70 synchronizes input clock signal CLKi, having a period of Pi, with the selection input SELNB. Each individual select signal SELi is a synchronized version of SELNB=i. SELi is synchronized on the falling edge of clock CLKi and is synchronized (with the clock signal being fed through an inverter to resynchronize with the falling edge) with a synchronizer flip-flop to generate a synchronized select signal SELi. SELi is then synchronized to clock CLKi by a normal flip-flop to generate a synchronized SELi signal. If the mean time between failure (MTBF) is not big enough, another synchronizer stage may be added. When the SELECT value changes, there are different times for the subsequent signals to become 0 (guardband) or a new value.

Figure 8:
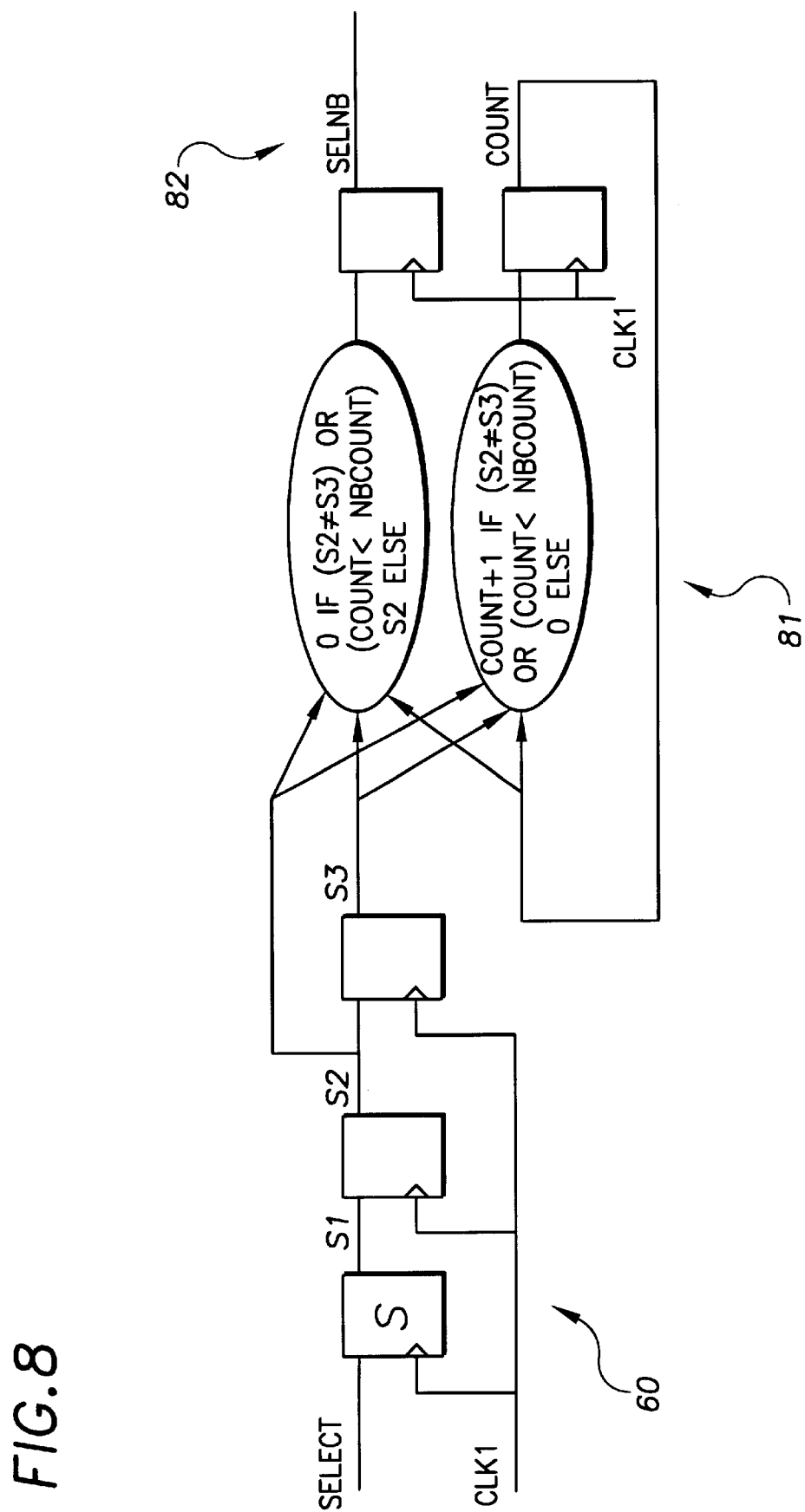
FIG. 8 is a logic diagram of an example embodiment of the no-select guardband circuit.

Referring to FIG. 8, the no-select guardband logic diagram 80 includes subcircuit 60 that first resynchronizes the SELECT signal to CLK1. This is the first step of the start of the no-select guardband, which will end with the creation of signal SELNB 82. Subcircuit 81 takes the selection input SELECT and codes the choice of selected clock input to a particular value {1, 2, . . . n}. The value of 0 needs to be added to the list of possible values, 0 corresponding to no clock signal being selected and the output at CLKOUT being low. A signal SELNB is then developed that is equal to 0 during a time of NBCOUNT period of CLK1 when the value of SELECT changes. Subcircuit 60 not only becomes the input select signal, with an additional flip-flop added, but also serves as an input to SELNB flip-flop and the COUNT flip-flop synchronized with CLK1. SELNB and counter COUNT interact with the select input signals to delay them long enough to switch from one clock signal to another without producing a glitch at the output. There is no upper limit to NBCOUNT but its value is self-limiting in that the microprocessor will stop if the delay between the selection inputs is too long.

Referring to subcircuit 81 (and the relationships within the ellipses), when S2 does not equal S3 or when COUNT value is less than NBCOUNT, then the SELNB value is 0. For all other conditions, SELNB is equal to the value of S2. When S2 does not equal S3 or when COUNT is less than NBCOUNT, then the COUNT value is incremented by 1. When S2 equals S3 and when COUNT is greater than or equal to NBCOUNT, then the COUNT remains 0.

The following is an example explanation of the formulae and variables used to create the no-select guardband and to achieve the synchronization between the clock inputs. There is also a discussion of the derivation of the guardband parameter NBCOUNT that forms part of the guardband calculation.

1) $tS2(new)[P1-tH, 2*P1+tSU]$ (where means "a value between")

2) $tSELNB(0)[2*P1-tH, 3*P1+tSU]$

3) $tSELNB(new)[(2+NBCOUNT)*P1-tH, (3+NBCOUNT)*P1+tSU]$

4) $tSELi(0)-tSELNB(0)[Pi-tH, 2*Pi+tSU]$

5) $tSELi(1)-tSELNB(new)[Pi-tH, 2*Pi+tSU]$

Referring further to FIG. 8, when the SELECT value changes, there are different times that the subsequent signals need to become 0 (guardband) or a new value. The variable tSU represents the setup time of a given flip-flop and variable tH represents the hold time of a given flip-flop. S2 is an intermediate signal generated by the synchronization of the SELECT signal to CLK1, while, P1 is the time period of clock CLK1, P2 is the period of clock CLK2, . . . etc. Equation 1 relates to tS2(new), which is the time from a SELECT signal transition to a S2 signal transition (front end of FIG. 7) and is derived as follows. The shortest time in which the SELECT signal transition occurs is just before the end of the hold time of the first flip-flop and changes the output of S1 instantaneously. At this point, the value of tS2(new)=P1-tH. The longest time in which the SELECT signal transition occurs is just after the beginning of the setup time of the first flip-flop and changes the output S1 on the next rising edge of CLK1 signal. Hence, the value of tS2(new)=2*P1+tSU. Therefore, the upper and lower boundaries of tS2(new) are the following values [P1-tH, 2*P1+tSU].

Equation 2 relates to tSELNB(0), which is the time from a SELECT signal transition to SELNB signal being low (no-select guardband). This signal occurs one CLK1 cycle later than tS2(new). Hence the upper and lower boundaries of tSELNB(0) are the following values [2*P1-tH, 3*P1+tSU].

Equation 3 relates to tSELNB(new), which is the time from a SELECT signal transition to SELNB signal having the same new value. This signal occurs by generating NBCOUNT during the time period of CLK1 cycle later than tSELNB(0) when the value of SELECT changes. Therefore, the upper and lower boundaries of tSELNB(new) become the following:

$[(2+NBCOUNT)*P1-tH, (3+NBCOUNT)*P1+tSU]$.

Equation 4 relates to tSELi(0), which is the time from a SELECT signal transition to SELi being low (the clock no longer being selected). SELi is a resynchronized version of SELNB, specifically when SELNB=i, logic by clock CLKi. Similar to the derivation of tS2(new), which is a resynchronization of the SELECT signal with CLK1, the result of tSELi(0)-tSELNB(0) is that the value is bounded by the values of [Pi-tH, 2*Pi+tSU].

Equation 5 relates to tSELi(1), which is the time from a SELECT signal transition to SELi being high (a new clock signal is selected). Similar to the derivation of tSELi(0), the result of tSELi(1)-tSELNB(new) is that the value is bounded by the values of [Pi-tH, 2*Pi+tSU].

Working through equations 1-5, the following two equations are derived:

6) $tSELi(0)[2*P1+Pi-2*tH, 3*P1+2*Pi+2*tSU]$

7) $tSELi(1)[(2+NBCOUNT)*P1+Pi-2*tH, (3+NBCOUNT)*P1+2*Pi+2*tSU]$

The fact that there is no glitch on the output is ensured for values of i and j among the group of: $\{1,2 \ldots n\}$, as soon as the following is achieved: $tSELi(0) \leq tSELj(1)$. CLKi clock is deselected before CLKj is selected, and thus the low pulse between the clock switching is at least equal to the low pulse duration of CLKj. This relationship can be represented by the following derivation of the earlier equations:

8) $NBCOUNT \geq (P1+2*max(Pi)-min(Pi)+2*tSU+2*tH)/P1$ with max(Pi) being the maximum of periods P1,P2, . . . Pi and min(Pi) being the minimum of periods P1,P2, . . . Pi. As an example, if max(Pi)=P1 and min(Pi)$\geq$2*tSU+2*tH, then NBCOUNT=3.

Figure 9:
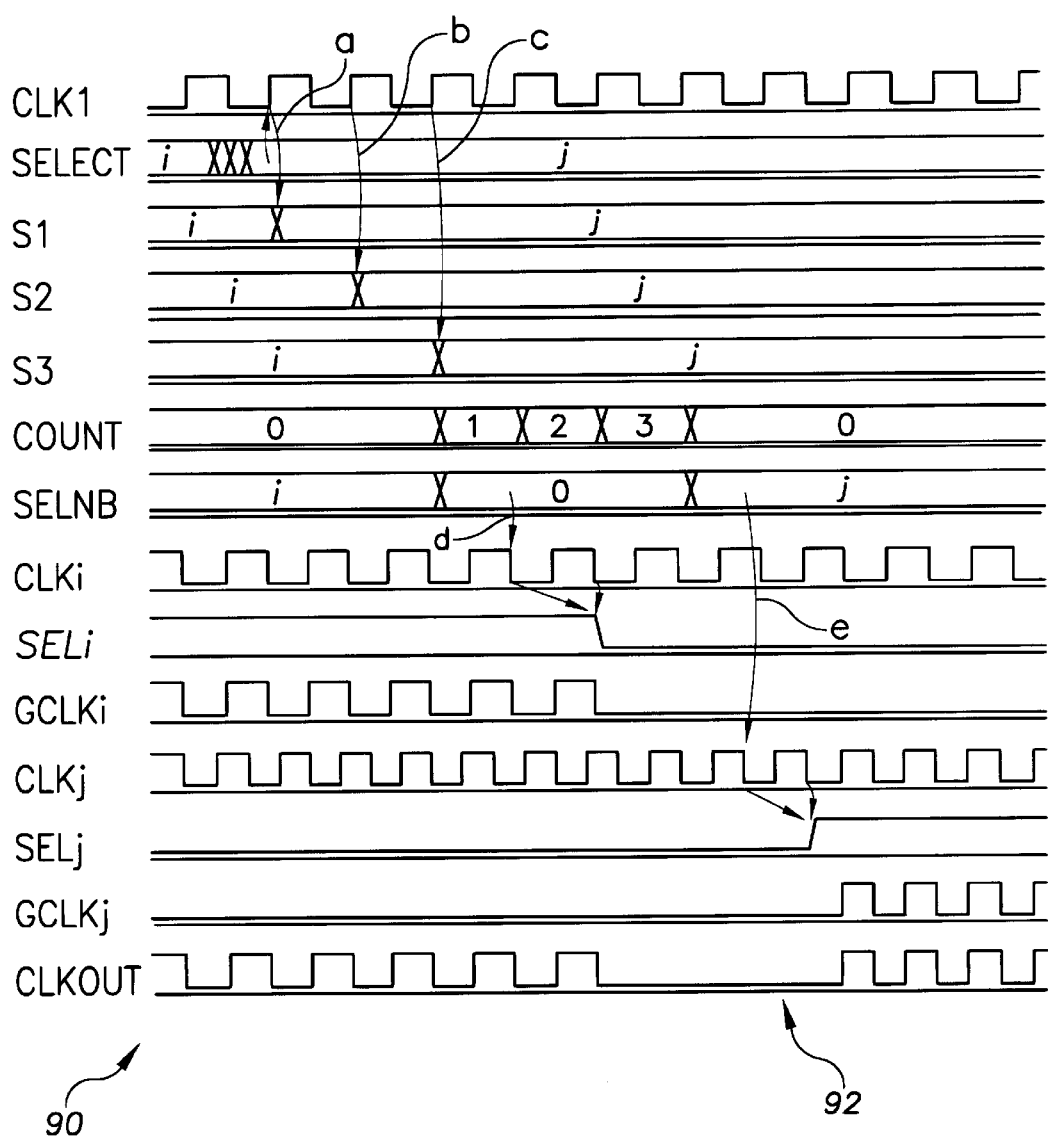
FIG. 9 is a timing diagram illustrating the interaction of several signals generated by an example circuit embodiment of the present invention.

FIG. 9 is a timing diagram 90 illustrating the multiplexer output of an example embodiment of the present invention. The input signal is CLK1 and in this example NBCOUNT is equal to 3 cycles of CLK1, which is the length of the no-select guardband 92. S1, S2 and S3 are the SELECT signal as it toggles through the flip-flops of logic diagram 80 before an alternate clock signal is selected. Arrows a, b and c indicate the synchronization of SELECT signal with CLK1 as it toggles through the flip-flops, all during COUNT=0 and SELNB=i. Arrows d and e indicate the synchronization of SELNB signal with CLKi and CLKj. During the time that SELNB is equal to 0, SELNB is synchronized with CLKi and the falling edge of SELi and results in a gated signal GCLKi that goes low when SELi goes low. When SELNB is equal to j, SELNB is synchronized with CLKj and the leading edge of SELj and results in a gated signal GCLKj that goes high when SELj goes high.

The various embodiments described above are provided by way of illustration only and are not intended to limit the invention. Those skilled in the art will readily recognize various modifications and changes that may be made to the present invention without strictly following the example embodiments and applications illustrated and described herein. The scope of the present invention is set forth in the following claims.

What is claimed is:

1. A method of switching between asynchronous data inputs in a digital system without causing a glitch in the output comprising the steps of:

generating a first clock input signal;

generating a second clock input signal;

synchronizing a select input signal with the first clock input signal, the select input signal deselecting the first clock signal and delaying selection of the second clock signal;

multiplexing the first and second clock signals with the select input signal to generate a multiplexed clock output signal corresponding to one of the clock input signals; and responsive to the select input signal, switching between the first and second clock input signals, the multiplexed output producing a momentary, pulse before producing an output signal corresponding to the second clock input clock signal, a width of the momentary pulse being a function of the selection delay of the select input signal.

2. The method of claim 1, wherein the step of switching signals includes synchronizing the select input signal with a no-select guardband system such that the select input signal does not select the second clock signal until the first clock signal has been deselected and the selection delay of one cycle has occurred, of the minimum of the first and second clock signals, thereby generating a momentary no signal output at the multiplexed clock output.

3. The method of claim 1, further including the step of providing a second select input signal that is synchronized with the second clock signal.

4. The method of claim 3, wherein the step of switching signals includes synchronizing the select input signals using a no-select guardband system such that the second select input signal does not go high before the first select input signal becomes low, thereby generating a momentary no signal output at the multiplexed clock output.

5. A method of switching between asynchronous data inputs in a digital system without causing a glitch in the output comprising the steps of:

generating a first clock input signal;

generating a second clock input signal;

synchronizing a first select input signal with the first clock input signal, the select input signal deselecting the first clock signal and delaying selection of the second clock signal;

synchronizing a second select input signal with the second clock signal;

multiplexing the first and second clock signals with the select input signal to generate a multiplexed clock output signal corresponding to one of the clock input signals;

responsive to the select input signal, switching between the first and second clock input signals, the multiplexed output producing a momentary pulse, before producing an output signal corresponding to the second clock input clock signal, a width of the momentary pulse being a function of the selection delay of the select input signal; and synchronizing the select input signals using a no-select guardband system such that the second select input signal does not go high before the first select input signal becomes low thereby generating a momentary no signal output at the multiplexed clock output, the no-select guardband system including a counter and a guardband select signal that interact with the first and second select input signals to create the selection delay.

6. A method of switching between asynchronous data inputs in a digital system without causing a glitch in the output comprising the steps of:

generating a first gated clock signal by synchronizing a first gating select input signal to a first clock input signal;

generating a second gated clock signal by synchronizing a second gating select input signal to a second clock input signal;

multiplexing the first and second gated clock output signals with a select input signal selection delay to generate a multiplexed clock output signal corresponding to one of the clock input signals; and switching from the first gated clock input signal to the second gated clock input signal, the multiplexed output producing a momentary pulse before producing an output signal corresponding to the second clock input clock signal, a width of the momentary pulse being a function of the selection delay of the select input signal.

7. The method of claim 6, wherein the step of switching signals includes synchronizing the select input signals using a no-select guardband system such that the second select input signal does not go high before the first select input signal becomes low, thereby generating a momentary no signal output at the multiplexed clock output.

8. The method of claim 6, wherein the first gating select input signal is synchronized to a falling edge of the first clock input signal.

9. The method of claim 8, wherein the second gating select input signal is synchronized to a leading edge of the second clock input signal.

10. A method of switching between asynchronous data inputs in a digital system without causing a glitch in the output comprising the steps of:

generating a first gated clock signal by synchronizing a first gating select input signal to a first clock input signal;

generating a second gated clock signal by synchronizing a second gating select input signal to a second clock input signal;

multiplexing the first and second gated clock output signals with a select input signal selection delay to generate a multiplexed clock output signal corresponding to one of the clock input signals; and switching from the first gated clock input signal to the second gated clock input signal, the multiplexed output producing a momentary pulse before producing an output signal corresponding to the second clock input clock signal, a width of the momentary pulse being a function of the selection delay of the select input signal; and synchronizing the select input signals using a no-select guardband system such that the second select input signal does not go high before the first select input signal becomes low, thereby generating a momentary no signal output at the multiplexed clock output, the no-select guardband system including a counter and a guardband select signal that interact with the first and second select input signals to create the selection delay.

11. The method of claim 10, wherein the counter has a subcounter that defines in clock cycles the duration of the selection delay.

12. The method of claim 11, wherein the subcounter has an adjustable value, the subcounter values being self-limiting such that a microprocessor in the digital system is not affected.

13. A method of switching between asynchronous data inputs in a digital system without causing a glitch in the output comprising the steps of:

generating a first gated clock signal output by synchronizing a first gating select input signal to the falling edge of a first clock input signal;

generating a second gated clock signal output by synchronizing a second gating select input signal to the falling edge of a second clock input signal;

multiplexing the first and second gated clock signals with a select input signal selection delay to generate a multiplexed output clock signal corresponding to one of the gated clock signals; and generating a no-select guardband between the first and second select input signals to synchronize switching from the first gated clock signal to the second gated clock signal such that the multiplexed clock output produces a momentary pulse of duration less than the minimum of each of a pulse of the first clock signal and a pulse of the second clock signal, before producing an output signal corresponding to the second input signal, a width of the momentary pulse being a function of the selection delay of the select input signal.

14. A method of switching between asynchronous data inputs in a digital system without causing a glitch in the output comprising the steps of:

generating a first gated clock signal output by synchronizing a first gating select input signal to the falling edge of a first clock input signal;

generating a second gated clock signal output by synchronizing a second gating select input signal to the falling edge of a second clock input signal;

multiplexing the first and second gated clock signals with a select input signal selection delay to generate a multiplexed output clock signal corresponding to one of the gated clock signals; and generating a no-select guardband between the first and second select input signals to synchronize switching from the first gated clock signal to the second gated clock signal such that the multiplexed clock output produces a momentary pulse of duration less than the minimum of each of a pulse of the first clock signal and a pulse of the second clock signal, before producing an output signal corresponding to the second input signal, a width of the momentary pulse being a function of the selection delay of the select input signal, the no-select guardband system including a counter and a guardband select signal that interact with the first and second select input signals to create the selection delay.

15. A digital circuit for switching between two or more asynchronous data inputs without causing a glitch in the output, comprising:

means for generating a first gated clock signal output signal synchronized by a first gating select input signal to a first clock input signal;

means for generating a second gated clock signal by synchronizing a second gating select input signal to a second clock input signal; and a digital multiplexer coupled to the gated clock signals for multiplexing the first and second gated clock output signals with a select input signal selection delay to generate a clock output signal corresponding to one of the clock input signals; and means for switching from the first gated clock input signal to the second gated clock input signal, the multiplexed output producing a momentary pulse before producing an output signal corresponding to the second clock input clock signal, a width of the momentary low pulse width being a function of the selection delay of the select input signal.

16. The digital circuit of claim 15, wherein switching means includes means for generating a no-select guardband between the first and second select input signals to synchronize switching from the first gated clock signal to the second gated clock signal such that the second select input signal does not go high before the first select input signal becomes low, thereby generating a momentary no signal output at the multiplexed clock output.

17. The digital circuit of claim 16, wherein the first gating select input signal is synchronized to a falling edge of the first clock input signal.

18. The digital circuit of claim 17, wherein the second gating select input signal is synchronized to a leading edge of the second clock input signal.

19. A digital circuit for switching between two or more asynchronous data inputs without causing a glitch in the output, comprising:

means for generating a first gated clock signal output signal synchronized by a first gating select input signal to a first clock input signal;

means for generating a second gated clock signal by synchronizing a second gating select input signal to a second clock input signal; and a digital multiplexer coupled to the gated clock signals for multiplexing the first and second gated clock output signals with a select input signal selection delay to generate a clock output signal corresponding to one of the clock input signals; and means for switching from the first gated clock input signal to the second gated clock input signal, the multiplexed output producing a momentary pulse before producing an output signal corresponding to the second clock input clock signal, a width of the momentary low pulse width being a function of the selection delay of the select input signal; and generating a no-select guardband between the first and second select input signals to synchronize switching from the first gated clock signal to the second gated clock signal such that the second select input signal does not go high before the first select input signal becomes low, thereby generating a momentary no signal output at the multiplexed clock output, the no-select guardband system including a counter and a guardband select signal that interact with the first and second select input signals to create the selection delay.

20. The digital circuit of claim 19, wherein the counter has a subcounter that defines in clock cycles the duration of the selection delay.

21. A digital for switching between two or more asynchronous data inputs without causing a glitch in the output, comprising:

a first clock signal generator adapted to generate a first input signal output;

a second clock signal generator adapted to generate a second clock input signal;

a select input signal generator coupled to the clock input signals and adapted to generate a first select signal that is synchronized with the first clock input signal, the select input signal generator configured to deselect the first clock signal and delay selection of the second clock signal;

a digital multiplpexer coupled to the clock signals and adapted to multiplex the first and second clock input signals with the select input signal selection delay to generate a clock output signal corresponding to one of the clock input signals; and switching means adapted to switch from the first clock input signal to the second clock input signal, the multiplexed output producing a momentary pulse producing an output signal corresponding to the second clock signal, a width of the momentary pulse being a function of the selection delay of the input signal.

22. The digital circuit of claim 21, wherein a second input signal is generated that is synchronized with the second clock signal.

23. The digital circuit of claim 22, wherein switching means includes means for generating a no-select guardband between the first and second select input signals to synchronize switching from the first clock signal to the second clock signal such that the second select input signal does not go high before the first select input signal becomes low, thereby generating a momentary no signal output at the multiplexed clock output.

24. The digital circuit of claim 23, wherein the first select input is synchronized on a falling edge of the first clock signal and the second select input signal is synchronized to a leading edge of the second input signal.

25. A digital circuit for switching between two or more asychonous data inputs without causing a glitch in the output, comprising:

a first clock signal generator adapted to generate a first clock input signal;

a second clock signal generator adapted to generate a second clock input signal;

a select input signal generator coupled to the clock input signals and adapted to generate a first select signal that is synchronized with the first clock input signal, the select input generator further adapted to generate a second select input signal is synchronized with the second clock signal, the select input signal generator configured to deselect the first clock signal and delay selection of the second clock signal;

a digital multiplexer coupled to the clock signals and adapted to multiplex the first and second clock input signals with the select input signal selection delay to generate a clock output signal corresponding to one of the clock input signals; and switching means adapted to switch from the first clock input signal to the second clock input signal, the multiplexed output producing a momentary pulse before producing an output signal corresponding to the second clock input clock signal, a width of the momentary pulse being a function of the selection delay of the select input signal, switching means further including means for generating a non-select guardband between the first and second select input signals to synchronize switching from the first clock signal to the second clock signal such that the second select input signal does go high before the first select input signal becomes low, thereby generating a momentary no signal output at the multiplexed clock output, the no-select guardband system including a counter and a guardband select signal that interact with the first and second input signals to create the selection delay.

26. The method of claim 25, wherein the counter has a subcounter that defines in clock cycles the duration of the selection delay.

27. A method of switching between asynchronous data inputs in a digital system without causing a glitch in the output comprising the steps of:

generating a first clock input signal;

generating a second clock input signal;

synchronizing a select input signal with the first clock input signal;

multiplexing the first and second clock signals with the select input signal to generate a multiplexed clock output corresponding to one of the clock input signals; and via the multiplexing and responsive to the select input signal, synchronous with the first clock signal deselecting the first clock signal, delaying selection of the second clock signal by producing a momentary pulse at the multiplexed clock output, and switching from the first clock signal to the second clock signal.

28. The method of claim 1, wherein the momentary pulse has a width that is longer than each of a minimum of a low pulse of the first clock and a low pulse of the second clock.

29. The digital circuit of claim 15, wherein the momentary pulse has a width that is longer than each of a minimum of a low pulse of the first clock and a low pulse of the second clock.

* * * * *